United States Patent [19]
Astle

[11] 4,263,565
[45] Apr. 21, 1981

[54] AMPLITUDE LIMITER WITH AUTOMATIC DUTY CYCLE CONTROL FOR USE IN A PHASE-LOCKED LOOP

[75] Inventor: Brian Astle, Princeton, N.J.

[73] Assignee: RCA Corporation, New York, N.Y.

[21] Appl. No.: 33,944

[22] Filed: Apr. 27, 1979

[51] Int. Cl.³ .................... H03L 7/06; H03K 3/017; H03K 5/08

[52] U.S. Cl. ........................ 331/15; 331/25; 307/265; 307/557

[58] Field of Search .............. 331/1 A, 15, 25; 307/264, 265, 237; 328/169

[56] References Cited

U.S. PATENT DOCUMENTS

| | | | |
|---|---|---|---|
| 3,805,167 | 4/1974 | Nash et al. | 307/265 X |
| 3,883,756 | 5/1975 | Dragon | 307/265 |
| 3,968,384 | 7/1976 | Tracey et al. | 307/237 |
| 4,004,235 | 1/1977 | Roberts | 331/1 A X |
| 4,008,440 | 2/1977 | Mizukoshi | 307/237 X |

Primary Examiner—Siegfried H. Grimm
Assistant Examiner—Edward P. Westin
Attorney, Agent, or Firm—Eugene M. Whitacre; William H. Meagher

[57] ABSTRACT

A limiter includes an amplifying stage with its operating point determined by a bias voltage developed across a capacitance associated with a charging path and a discharging path. With alternate disabling and enabling of one of the paths controlled by a switching device with a duty cycle reflective of the limiter output duty cycle, the average potential across the capacitance varies in accordance with changes in the duty cycle of the limiter output. The variation sense is selected such that the resultant alterations of the operating point oppose deviations of the duty cycle from a chosen norm (e.g., 50%).

5 Claims, 3 Drawing Figures

AMPLITUDE LIMITER WITH AUTOMATIC DUTY CYCLE CONTROL FOR USE IN A PHASE-LOCKED LOOP

The present invention relates generally to amplitude limiters and to signal processing systems employing such limiters, and particularly to amplitude limiters of a novel form advantageous for use in processing signal inputs to phase comparators of a digital type, and to signal processing systems employing such limiters and comparators.

In a phase lock loop (PLL) system, the phase of an external periodic signal is compared with the phase of a locally generated periodic signal to develop an error signal, for use in controlling the frequency of the locally generated signal to maintain the system in lock. While the error signal developed by the phase comparator should be proportional to the phase difference existing between the two signals being compared, it desirably should be unaffected by amplitude variations which the external signal may exhibit. Use of a digital type of phase comparator is often desired in many PLL system applications, because such a comparator type is well suited for manufacturing in integrated circuit form; however, digital type of phase comparator typically provides an output which is responsive to amplitude variations of its input signals. A commom solution to such an amplitude sensitivity problem in PLL systems employing a digital type of phase comparator is inclusion of an amplitude limiter in the external signal path so as to ensure delivery to the phase comparator of input signals of substantially constant amplitude.

While such inclusion of a conventional amplitude limiter may, with appropriate choice of limiter parameters relative to the expected magnitudes of the external signal, provide a high degree of assurance that the digital comparator will receive substantially constant amplitude inputs despite the amplitude variations of the external signal, it is herein recognized that such control of the digital comparator input signal amplitude is not necessarily fully dispositive of adverse effects of the external signal amplitude variations on error voltage development by the phase comparator. In particular, it is recognized that, on the one hand, a conventional amplitude limiter can exhibit some degree of asymmetry of limiting, with a consequence of such asymmetry being that the duty cycle of the limiter output is subject to variation in response to limiter input amplitude variations, while, on the other hand, the error voltage developed by a digital phase comparator may be subject to variation in response to duty cycle changes of an input signal thereto (as is the case, for example, with digital phase comparators of the exclusive OR type described in the RCA Digital Integrated Circuits Application Note No. ICAN-6101).

Pursuant to the principles of the present invention, an advantageous amplitude limiter arrangement incorporates novel bias voltage developing means, controlled by a periodic circuit enablement of the duration which is reflective of the duty cycle of the limiter output, so as to effect adjustment of limiter biasing in a sense opposing undesired deviations of the limiter output duty cycle from a chosen norm. In a PLL system employing a digital type of phase comparator, inclusion of such an amplitude limiter arrangement in the external signal path ensures that the error voltage output of the phase comparator will be substantially independent of amplitude variations of the external signal by achieving development of comparator input signals with substantial constancy of both amplitude and duty cycle. Maintenance of the desired output duty cycle of the described arrangement also substantially ensures, in the instance of low input amplitudes, avoidance of failure modes for the limiter in which operation asymmetry would result in the output remaining continually at one clamping level.

In accordance with an illustrative embodiment of the present invention, the limiter bias voltage is developed across a capacitance associated with a charging path and a discharging path. With alternate disabling and enabling of one of the paths controlled by a switching device with a duty cycle reflective of the limiter output duty cycle, the average potential across the capacitance varies in accordance with changes in the duty cycle of the limiter output. The variation sense is selected such that the resultant alterations of the operating point of the limiter oppose deviations of the duty cycle from the chosen norm.

In an illustrative utilization of the present invention, the above-described limiter arrangement is advantageously employed to process the external signal in a PLL system serving a frequency multiplier function. In such PLL system, a voltage controlled oscillator (VCO) has its output divided in frequency by a frequency divider. The output of the frequency divider is compared in phase with an external reference signal processed by the above-described limiter arrangement. The resultant error signal output of the comparator is used to control the VCO frequency so as to bring the divided-down frequency into synchronism with the reference signal. The thus controlled VCO provides the frequency multiplier output.

Illustratively, such a frequency multiplier may be utilized in a color television receiver to develop, from external reference oscillations of color subcarrier frequency (e.g., approximately 3.58 MHz.) suitable clocking signals of an appropriate higher frequency (e.g., approximately 10.74 MHz.) for control of CCD comb filters of the type described in the copending U.S. patent application, Ser. No. 930,379, of J. E. Carnes, et al. In such use, the PLL system elements (limiter, VCO, frequency divider, phase comparator) may advantageously be realized in integrated circuit form on the same monolithic integrated circuit chip with the CCD comb filter elements.

In the accompanying drawing

Figure 1:
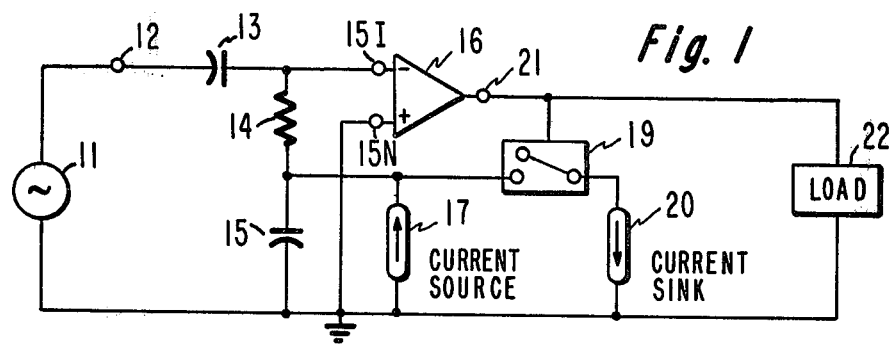
FIG. 1 illustrates, partially schematically and partially via block diagram representation, a signal limiter arrangement constructed in accordance with the principles of the present invention.

In FIG. 1, a voltage amplifier 16, having inverting and non-inverting input terminals (15I and 15N) and an output terminal (21), is illustrated. The amplifier 16 desirably has a high input impedance, having no substantial loading effects on the source of voltage applied to its input terminals, and desirably has a low output impedance such that its voltage gain remains high when a load 22 is connected between the output terminal 21 and a common reference potential point, here shown as ground.

The transfer characteristic of amplifier 16 is such that high gain is maintained for input signals below a certain amplitude threshold, whereas for input signals exceeding this threshold, the amplifier output remains clamped at respective extreme levels of excursion. Thus, when an alternating signal of sufficient amplitude is applied to the input terminals, the output wave shape will show an amplitude-limited output with alternating periods of dwell at respective clamping levels, and with relatively rapid transitions between the two states. This corresponds to the well-known action of a signal limiter.

Signal source 11, supplying an alternating signal of sufficient amplitude to cause amplifier 16 to operate in the limiting mode referred to above, has one terminal coupled to the inverting input terminal 15I via the limiter input terminal 12 and a capacitor 13; the other terminal of source 11 and the non-inverting input terminal 20 of amplifier 16 are connected to ground.

The inverting input terminal of amplifier 16 is further coupled by a resistor 14 to one plate of an averaging capacitor 15, whose other plate is connected to ground, so that the average potential across capacitor 15 can control the working of bias point of amplifier 16. Means for impressing electrical charge upon the capacitor 15 is provided by a current source 17 continuously coupled across the capacitor 15. A discharging path, formed by a current sink 20, is discontinuously associated with capacitor 15 through the operation of an electronic switch 19 (symbolically represented as a single-pole, single-throw switch).

The amplitude-limited output signal which appears at the output terminal 21 of amplifier 16 is used to control electronic switch 19 so that switch 19 closes, coupling current sink 20 across capacitor 15, when the amplitude-limited output signal dwells at one of its extreme excursions, whereas switch 19 opens to decouple current sink 20 from capacitor 15 when the output signal dwells at its other extreme excursion. The magnitude of the current demanded by current sink 20 is of a selected greater level than the magnitude of available current supplied by current source 17. Consequently, during the time when switch 19 is open, a charging of capacitor 15 occurs, whereas during the time when switch 19 is closed, a discharging of capacitor 15 occurs. Thus, the alternating signal output from amplifier 16 will cause periods of discharging current flow from the ungrounded capacitor terminal to ground through sink 20 to alternate with periods of capacitor charging. The average values of the respective charging and discharging currents will depend on the duty cycle of operation of switch 19.

For an output signal of constant frequency from amplifier 16, an average potential difference equilibrium will exist across the plates of capacitor 15 when the average net change of charge is zero. This occurs when the algebraic sum of the current due to source 17 and the average current drawn by current sink 20 is zero.

With all other parameters constant, a change in the duty cycle of operation of switch 19, which is equal to the duty cycle of the output signal from amplifier 16, will cause the average potential difference across the plates of capacitor 15 to change to a different point of equilibrium.

Generally, a bias point can be found for a given, periodically alternating, input signal which will cause limiting to occur in a given limiting amplifier with a degree of symmetry such that the output signal duty cycle will be one-half or some other chosen value in the neighborhood of one-half. Values significantly different from this may also be achievable for particular types of input signal waveform.

In the limiter shown in FIG. 1, given a desired duty cycle of the output signal of amplifier 16 and hence of the switch 19, it is therefore possible to select the magnitudes of current source 17 and current sink 20 so that the potential at the ungrounded plate of capacitor 15 equals the bias required to cause amplifier 16 to produce an output signal having the desired duty cycle. The sense of the current source and sink polarities as well as their relative magnitudes are such that any deviation in the output signal duty cycle from the desired value causes the bias applied to amplifier 16 to change in a direction tending to reduce the extent of such deviation. Illustratively, for achievement of a 50% duty cycle, the magnitude of the current demanded by current sink 20 is twice the magnitude of the current supplied by current source 17.

It will be seen that correction can take place despite imprecisely defined limiting characteristics in amplifier 16. Moreover, the exact value of capacitor 15 is not of consequence, it being only necessary that an adequate averaging effect be achieved of the charging and discharging currents.

As will be recognized, the arrangement of FIG. 1 constitutes a regulating system with negative feedback. Although such a system is basically stable, the potential for instability due to excess phase shift and gain changes with frequency exists as with most feedback control systems. The resistor 14 in combination with the capacitor 13 serves the function of filtering the bias voltage applied to amplifier 16 to aid in insuring stability of operation. For this purpose, the time constant of the combination of resistor 14 (plus source resistance) and capacitor 13 should be long relative to period length for the signal supplied by source 11.

Figure 2:
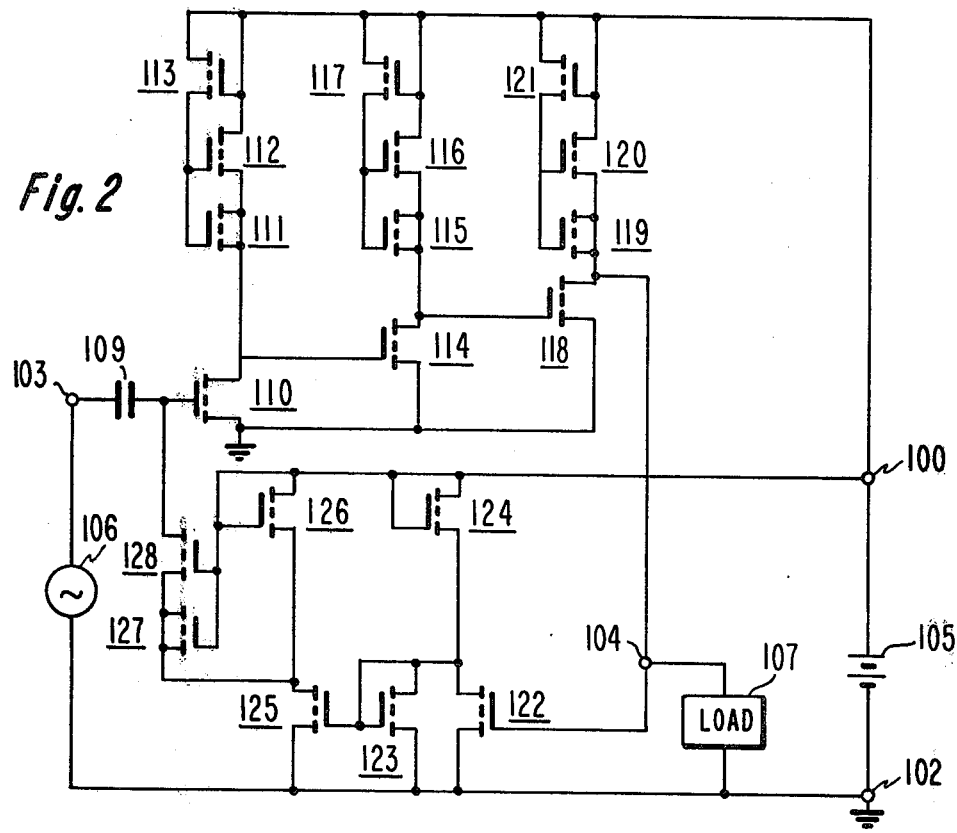
FIG. 2 illustrates schematically an illustrative circuit implementation of a limiter, embodying the present invention, and which is suitable for integrated circuit fabrication with N-channel Metal Oxide Semiconductor (NMOS) processing.

FIG. 2 shows a schematic diagram of an embodiment of the invention suitable for fabrication as an integrated circuit (IC) using NMOS technology.

This fabrication technology makes available to the circuit designer N-channel field effect transistors (FET's) having very high gate to source impedance. The characteristics of such transistors can be closely matched between devices within the integrated circuit; in particular, the mutual conductances of the transistors can be designed to have predictable ratios to one another by appropriate scaling of the device geometries.

In the circuit of FIG. 2, a DC power source, here shown as battery 105, supplies a positive operating potential to terminal 100 and a negative operating potential to terminal 102, which is also connected to a common reference potential, here shown as ground.

A source of AC signals (106) is connected between input terminal 103 and ground. Terminal 104 applies an output signal to the load 107 whose other end is connected to ground.

The required gain is provided by a three-stage amplifier of which transistor 110 is the first stage amplifying transistor. The source electrode of transistor 110 is connected to ground and its gate electrode is coupled by capacitor 109 to receive the input signal from terminal 103.

Devices 111, 112 and 113 are interconnected in a well-known manner to provide a load circuit for transistor 110 of a form permitting rapid transitions between limiting levels in the output of the amplifier. Device 112 serves as an active load for transistor 110, with its source electrode connected to the drain electrode of transistor 110 and its drain electrode connected to the supply terminal 100. Device 111, with its gate electrode connected to the gate electrode of transistor 112, and its source and drain electrodes connected in common to the source electrode of transistor 112, serves as a bootstrapping capacitance across the gate and source electrodes of load transistor 112. Device 113, with its drain and gate electrodes connected in common to the supply terminal 100, and its source electrode connected to the gate electrode of transistor 112, serves as a non-linear resistance with diode-like characteristics for biasing the gate electrode of the load transistor 112.

The drain electrode of transistor 110 is connected to the gate electrode of transistor 114. With its source electrode returned to ground, and its drain electrode connected to a load circuit of the above-described type in which devices 115, 116 and 117 are the direct counterparts of devices 111, 112 and 113, respectively, transistor 114 serves as a second stage amplifying transistor. The gate electrode of transistor 118 is connected to the drain electrode of transistor 114. With its source electrode returned to ground, and its drain electrode connected to a load circuit of the above-described type in which devices 119, 120 and 121 are the direct counterparts of devices 111, 112 and 113, respectively, transistor 118 serves as a third stage amplifying transistor.

The limiter output signal appears at the drain electrode of transistor 118 and is coupled via output terminal 104 to the load 107. Because of the high gain and fast response time of the amplifier, the output signal will show fast alternating transitions between a first level substantially equal to the potential existing at the positive supply terminal and a second level substantially at ground potential.

Besides driving the load circuit, the output signal is further coupled by direct connection to the gate electrode of device 122, whose source electrode is grounded. The conduction channel of this device, which will be alternatively switched between a state of high conductivity and a state of high resistance by the limiter output signal, is shunted across the conduction channel of device 123, which has its source electrode grounded and its gate and drain electrodes connected in common to the drain electrode of device 122.

Device 124, having its drain and gate electrodes connected to the positive supply terminal 100 and its source electrode connected to the drain electrodes of devices 122 and 123 serves as a current source therefor. A device 125, with its source electrode grounded and its gate electrode connected to the joined gate and drain electrodes of device 123, is disposed with device 123 in the well-known configuration of a current mirror.

A current source for device 125 is provided by the non-linear resistance exhibited by the conduction channel of device 126, which has its gate and drain electrodes connected in common to the supply terminal 100, and its source electrode connected to the drain electrode of device 125. The conduction channel of device 126 is shunted by a capacitance formed by device 127, with its gate electrode connected to supply terminal 100, and its source and drain electrodes connected in common to the source electrode of device 126. The conduction channel of device 128 provides a resistive path between one terminal of the capacitance formed by device 127 and the gate electrode of the input amplifying transistor 110, with the source electrode of device 128 connected to the joined source and drain electrodes of device 127. With the gate electrode of device 128 connected to the gate electrode of device 127, the resistance exhibited by the conductive channel of device 128 is maintained in a desired range suitable for its filtering function by the potential across the capacitance formed by device 127.

When an output signal excursion to the ground potential limiting level places device 122 in its high resistance condition, the current supplied by source 124 will provide the input to the current mirror formed by devices 123 and 125. By suitable scaling of the geometries of devices 123, 124 and 125 relative to the geometry of device 126, the current demand of the drain electrode of the mirror output device 125 under these circumstances can be made to exceed the current available from source 126 by a desired magnitude. Illustratively, for the purpose of maintenance of a 50% cycle, the scaling is such that the current demanded by transistor 125 is twice as great as the current provided by source 126. The deficit is supplied by displacement current primarily from capacitance 127, resulting in a charging of capacitance 127.

When an opposite polarity output signal excursion to the positive supply potential limiting level occurs, device 122 is rendered heavily conductive, reducing the gate to source bias on mirror devices 123 and 125 to substantially zero, whereby the current demanded by the drain electrode of device 125 goes to substantially zero. During such an excursion, with device 125 substantially non-conductive, capacitance 127 is subject to discharging via the conduction channel of device 126.

Thus, it will be seen that periods of charging of capacitance 127 will alternate with periods of discharging thereof. The average values of the respective charging and discharging currents will depend on the duty cycle of switching of device 122, and, hence, on the duty cycle of the output signal of the limiter.

The resultant control voltage, developed across capacitance 127, and further filtered by the action of resistance 128 and capacitor 109, adjusts the working point of the three-stage amplifier so that limiting takes place with the degree of symmetry appropriate to production of the desired duty cycle value (i.e., 50% for the described illustrative example).

It will be noted that the invention embodiment of FIG. 2, while effecting duty cycle control via operating techniques similar to those employed by the invention embodiment of FIG. 1, differs therefrom in several details of circuit configuration. For example, it will be observed that the capacitance (127) subject to periodic charging and discharging is returned to the ungrounded terminal (100) of the power supply in FIG. 2, in contrast with the return of the capacitance (15) to ground in FIG. 1. In accommodation of this capacitance location, the switched current path device (125) in the FIG. 2 arrangement effects charging of capacitance 127 when switched in circuit therewith, and permits discharging of capacitance 127 when switched effectively out of circuit; in contrast, the switched current path (current sink 20) in the FIG. 1 arrangement effects discharging of capacitance 15 when switched in circuit therewith, and permits charging of capacitance 15 when switched effectively out of circuit.

Figure 3:
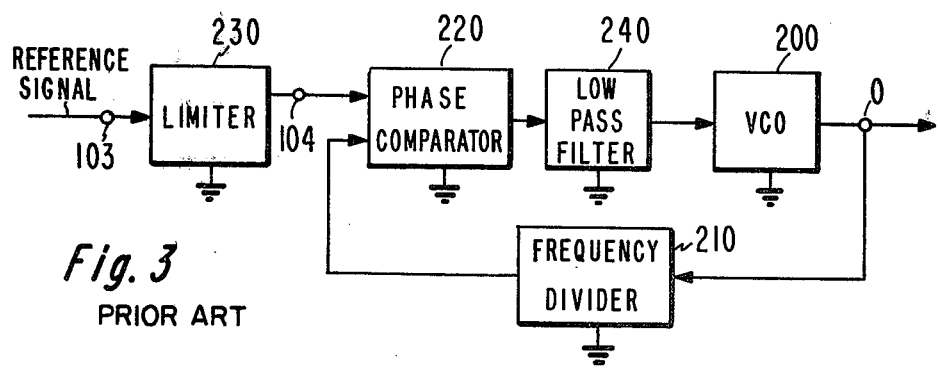
FIG. 3 provides a block diagram illustration of a phase-lock loop system in which the limiter of FIG. 2 may be advantageously used.

FIG. 3 provides a block diagram illustration of a PLL system serving a frequency multiplier function in which advantage may be taken of the limiter arrangements herein above described. In FIG. 3, a voltage controlled oscillator (VCO) 200 develops an oscillatory output which is supplied to a frequency divider 210. The output of the frequency divider is supplied as one input to a phase comparator 220. The other input to phase comparator 220 is supplied by a limiter 230, illustratively of the type shown in FIG. 2, which processes an external reference signal supplied to input terminal 103. The processed reference signals appearing at the limiter output terminal 104 exhibit substantial constancy of both amplitude and duty cycle, despite variations, if any, in the amplitude of the reference signals delivered to the limiter input. The output of phase comparator 220 is subject to filtering by a low pass filter 240 to develop a control voltage for application to the control terminal of VCO 200.

In operation of the PLL system of FIG. 3, the VCO 200 will develop at its output terminal O a phase-locked, frequency multiplied version of the input reference signals. In an illustrative utilization of the PLL system of FIG. 3: the input reference signals supplies to terminal 103 comprise reference oscillations of color subcarrier frequency (e.g., approximately 3.58 MHz.) derived from the reference color oscillator of a color television receiver; the frequency division factor associated with frequency divider 210 is three; and the output of VCO 200 comprises signals of a frequency (e.g., approximately 10.74 MHz.) three times the color subcarrier frequency, which serve as clocking signals for a CCD comb filter effecting luminance/chrominance signal separation (e.g., of the type described in the aforementioned Carnes, et al. application).

What is claimed is:

1. Apparatus comprising the combination of:
a limiter, having an input terminal coupled to receive an AC input signal, for developing therefrom an output signal confined to signal excursions between first and second limiting levels oppositely disposed with respect to an intermediate level;
a capacitance;
first charge modifying means coupled to said capacitance for modifying the state of charge of said capacitance in a first direction of change and at a first rate of change with time;
second, selectively enabled, charge modifying means coupled to said capacitance for modifying the state of charge of said capacitance in a second direction of change and at a second rate of change with time, said second direction of change being of opposite sense to said first direction of change;
means, coupled to said second charge modifying means and responsive to said output signal, for enabling said second charge modifying means only during output signal excursions beyond said intermediate level in the direction of said first limiting level;
means coupled to said capacitance for supplying to said input terminal a bias voltage subject to variation in response to the variations in the charge stored by said capacitance;
wherein said first and second directions of charge and the relative magnitudes of said first and second rates of change with time are such that said bias voltage variations supplied to said input terminal oppose departures of the ratio of the respective time durations of (1) each output signal excursion above said intermediate level, and (2) the sum of the time duration of said output signal excursion above said intermediate level and the time duration of the succeeding output signal excursion below said intermediate level, from a predetermined duty cycle.

2. Apparatus as set forth in claim 1 wherein said first charge modifying means is continuously enabled.

3. Apparatus comprising the combination of:
a limiter, having an input terminal coupled to receive an AC input signal, for developing therefrom an output signal confined to signal excursions between first and second limiting levels oppositely disposed with respect to an intermediate level;
a capacitance;
a charging circuit for said capacitance including a charging current path, coupled to said capacitance and constrained to convey a first current, and a discharging circuit for said capacitance including a discharging current path, coupled to said capacitance and constrained to convey a second current; one of said current paths being continuously enabled and the other of said current paths being discontinuously enabled;
means responsive to said output signal for enabling said other current path only during output signal excursions beyond said intermediate level in the direction of said first limiting level;
means coupled to said capacitance for supplying to said input terminal a bias voltage subject to variation in response to variations in the charge stored by said capacitance;
wherein the poling and relative magnitudes of said first and second currents are such that said bias voltage variations supplied to said input terminal oppose departures of the ratio of the respective time durations of (1) each output signal excursion above said intermediate level, and (2) the sum of the time duration of said output signal excursion above said intermediate level and the time duration of the succeeding output signal excursion below said intermediate level, from a predetemined duty cycle.

4. In a phase lock loop system including a voltage controlled oscillator, a phase comparator, means responsive to an output of said voltage controlled oscillator for supplying a local oscillation input to said phase comparator, a signal path for supplying a reference signal input to said phase comparator, and means responsive to an error voltage output of said phase comparator for altering the output of said voltage oscillator in a sense opposing deviations from a predetermined phase relationship between said reference and local oscillation inputs to said phase comparator, for use with a source of AC reference signals of a reference frequency but undesirably subject to amplitude variations; apparatus comprising:
signal limiting means, interposed in said signal path and having an input terminal disposed to receive said AC reference signals from said source, for forming said reference signal input for said phase comparator in the form of waves of said reference frequency alternately dwelling at respective first and second limiting levels with relatively rapid transitions therebetween;
means, responsive to said reference signal input formed by said limiting means and subject to operation in a first state during those periods when said waves dwell at said first limiting level and to operation in a second state during those periods when said waves dwell at said second limiting level, for developing a voltage indicative of departures, if any, of the duty cycle of said waves from a predetermined norm; and means for utilizing said voltage to alter the operation of said limiting means in a sense tending the oppose said departures;

wherein said voltage developing means includes:

a capacitance; and switching means, responsive to said reference signal input formed by said limiting means, for causing modification of the state of charge of said capacitance in a first sense during those periods when said waves dwell at said first limiting level, and for causing modification of the state of charge of said capacitance in a second sense, opposite to said first sense during those periods when said waves dwell at said second limiting level.

5. In a frequency multiplier comprising a phase lock loop system including a voltage controlled oscillator, a phase comparator, a frequency divider responsive to an output of said voltage controlled oscillator for supplying a frequency divided local oscillation input to said phase comparator, a signal path for supplying a reference signal input to said phase comparator, and means responsive to an error voltage output of said phase comparator for altering the output of said voltage controlled oscillator in a sense opposing deviations from a predetermined phase relationship between said reference and local oscillation inputs to said phase comparator, for use with a source of AC reference signals, of a reference frequency but undesirably subject to amplitude variations, in developing output signals having a frequency corresponding to a predetermined multiple of said reference frequency; apparatus comprising the combination of:

signal limiting means, comprising an amplifier interposed in said signal path and having an input terminal disposed to receive said AC reference signals from said source, for forming said reference signal input for said phase comparator in the form of waves of said reference frequency alternately dwelling at respective first and second limiting levels with relatively rapid transitions therebetween;

means, responsive to said reference signal input formed by said limiting means and subject to operation in a first state during those periods when said waves dwell at said first limiting level and to operation in a second state during those periods when said waves dwell at said second limiting level, for developing a voltage indicative of departures, if any, of the duty cycle of said waves from a predetermined norm; and means for applying said voltage to said input terminal to control the biasing of said amplifier in a manner tending to oppose said departures;

wherein said voltage developing means includes:

a capacitance; and switching means, responsive to said reference signal input formed by said limiting means, for causing a modification of the state of charge of said capacitance in a first sense during those periods when said waves dwell at said first limiting level, and for causing a modification of the state of charge of said capacitance in a second sense, opposite to said first sense, during those periods when said waves dwell at said second limiting level.

* * * * *

UNITED STATES PATENT AND TRADEMARK OFFICE
CERTIFICATE OF CORRECTION

PATENT NO. : 4,263,565
DATED : April 21, 1981
INVENTOR(S) : Brian Astle

It is certified that error appears in the above—identified patent and that said Letters Patent is hereby corrected as shown below:

Column 2, line 7, "would" should be -- could --;

Column 7, line 62, "charge" should be -- change --;

Column 8, line 50, between "voltage" and "oscillator" should be -- controlled --.

Signed and Sealed this

Twenty-second Day of September 1981

[SEAL]

Attest:

GERALD J. MOSSINGHOFF

Attesting Officer

Commissioner of Patents and Trademarks